United States Patent [19]
Fang et al.

[11] Patent Number: 5,567,940
[45] Date of Patent: Oct. 22, 1996

[54] INFRARED RAY SENSOR AND ITS PRODUCING METHOD

[75] Inventors: Yen-Kun Fang; Fu-Yuan Chen; Jiann-Ruey Chen, all of Tainan, Taiwan

[73] Assignee: National Science Council, Taipei, Taiwan

[21] Appl. No.: 449,387

[22] Filed: May 23, 1995

[51] Int. Cl.$^6$ ................................................. H01L 37/00
[52] U.S. Cl. ............................. 250/338.2; 204/192.18; 427/554
[58] Field of Search ................ 250/338.2; 427/554; 204/192.18

[56] References Cited

U.S. PATENT DOCUMENTS 4,250,384  2/1981  Pulvari ............................. 250/330
5,395,663  3/1995  Tabata et al. ..................... 427/554

FOREIGN PATENT DOCUMENTS 56-45827  4/1981  Japan ............................ 204/192.18

Primary Examiner—Constantine Hannaher
Attorney, Agent, or Firm—Knobbe, Martens, Olson & Bear

[57] ABSTRACT

The present invention is related to an infrared ray sensor including a substrate having a p-n junction, a ferroelectric film formed on a surface of the substrate for sensing infrared ray, and a metal film formed on the ferroelectric film for serving as an infrared-ray receiving electrode. The present invention is also related to a method for producing the IR sensor including steps of: providing the substrate having the p-n junction; depositing the ferroelectric film on the surface of the substrate in a radio frequency (RF) sputtering system; and depositing the metal film on the ferroelectric film by vapor evaporation. Alternatively, the deposition of the ferroelectric film on the surface of the substrate can be performed in a KrF pulse-mode laser evaporation system.

23 Claims, 4 Drawing Sheets

INFRARED RAY SENSOR AND ITS PRODUCING METHOD

FIELD OF THE INVENTION

The present invention is related to a sensor, and particularly to an infrared ray sensor; and also related to a method for producing the infrared ray sensor.

BACKGROUND OF THE INVENTION

Infrared sensors are commonly used in the fields of science, business and military application. For example, an infrared sensor can serve as a laser detector, a missile guider, a remote controller, a burglary alarm and a thermal image detector, etc. Two major types are categorized for the infrared sensors, i.e. thermal electric type and quantum type. Compared with the other infrared sensors, the thermal electric type sensors have the following advantages:

1. They can be operated at room temperature, while the quantum type sensors have to be operated at a low temperature ranged within $-100°$ C. and $-200°$ C. for abating noises; and
2. They respond even faster than that of Golay cells.

A conventional thermal electric type IR sensor possesses a capacitor structure or a metal/ferroelectric film/semiconductor field effect transistor (MFS-FET) structure. The thickness of the film cannot be too small (in general, greater than 2 µm) for the purpose of preventing carriers from penetrating through the ferroelectric film. Such a sensor is called a thick film type IR sensor. The thick film type IR sensor has a thick ferroelectric film so that the heat capacity of the sensor is large, and the response time is long (longer than 40 µs). In addition, when the intensity of the current converted from the infrared ray is smaller than e.g. 1 µA, an additional amplifier will be required for switch operations and the response time will be further extended.

SUMMARY OF THE PRESENT INVENTION

An object of the present invention is to provide an IR sensor which can be operated at room temperature.

Another object of the present invention is to provide an IR sensor which has a short response time.

Another object of the present invention is to provide an IR sensor which can proceed switching operations independently.

In accordance with the present invention, an infrared ray sensor includes a substrate having a p-n junction, a ferroelectric film formed on a surface of the substrate for sensing infrared ray, and a metal film formed on the ferroelectric film for serving as an infrared-ray receiving electrode.

In accordance with another aspect of the present invention, the substrate can be a $n/p^+$ type silicon substrate or a $p/n^+$ type silicon substrate. The ferroelectric film can be a film of lead titanate, which has a thickness ranged from about 200 Å to 1000 Å. The ferroelectric film also can be a film of lead zirconium titanate ($PbZr_{0.53}Ti_{0.47}O_3$).

In accordance with another aspect of the present invention, the metal film can be a film of gold. The IR sensor preferably further includes an aluminum film formed on a surface of the substrate opposite to the surface having the ferroelectric film thereon for serving as a contact electrode.

In accordance with another aspect of the present invention, a method for producing the IR sensor includes steps of: providing the substrate having the p-n junction; depositing the ferroelectric film on the surface of the substrate in a radio frequency (RF) sputtering system; and depositing the metal film on the ferroelectric film by vapor evaporation.

In accordance with another aspect of the present invention, the substrate can be a $n/p^+$ type silicon substrate or a $p/n^+$ type silicon substrate. The ferroelectric film can be a film of lead titanate, which has a thickness ranged from about 200 Å to 1000 Å. The metal film can be a film of gold. The IR sensor preferably further includes an aluminum film formed on a surface of the substrate opposite to the surface having the ferroelectric film thereon for serving as a contact electrode.

In accordance with another aspect of the present invention, the RF sputtering system has a target having a diameter of 5 cm, a clearance of 5 cm between the target and the substrate, an RF input power of 100 W, a sputtering gas species of 90% Ar and 10% $O_2$, a gas pressure of 6 mtorr and a substrate temperature of 500° C.

In accordance with another aspect of the present invention, a method for producing the IR sensor includes steps of: providing the substrate having the p-n junction; depositing the ferroelectric film on the surface of the substrate in a KrF pulse-mode laser evaporation system; and depositing the metal film on the ferroelectric film by vapor evaporation.

In accordance with another aspect of the present invention, the substrate can be a $n/p^+$ type silicon substrate or a $p/n^+$ type silicon substrate. The ferroelectric film can be a film of lead zirconium titanate ($PbZr_{0.53}Ti_{0.47}O_3$). The metal film can be a film of gold. The IR sensor preferably further includes an aluminum film formed on a surface of the substrate opposite to the surface having the ferroelectric film thereon for serving as a contact electrode.

In accordance with another aspect of the present invention, the KrF pulse-mode laser evaporation system has a laser beam wavelength of 248 nm, a pulse width of 25 ns, an operation frequency of 3 Hz, and an output energy of 400 mJ.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
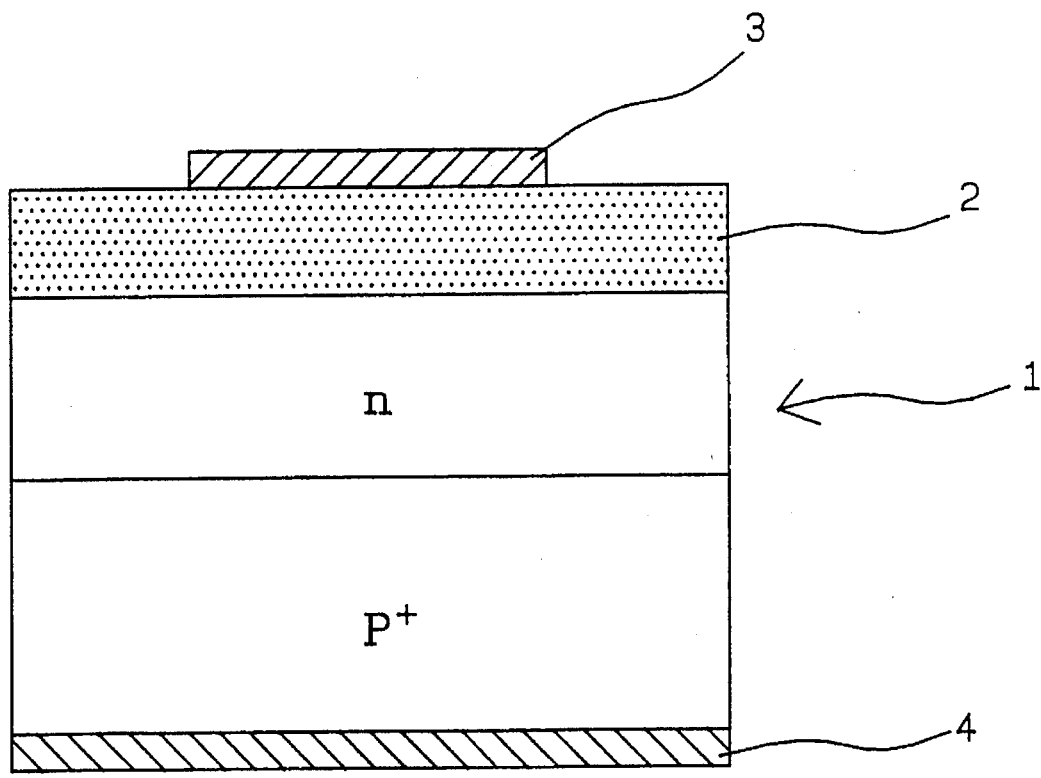
FIG. 1 is a schematic diagram showing the structure of a preferred embodiment of an IR sensor according to the present invention.

Please refer to FIG. 1 which is a schematic diagram showing the structure of a preferred embodiment of an IR sensor according to the present invention. In this preferred embodiment, the substrate 1 is a n/p$^+$ substrate, the ferroelectric film 2 is a lead titanate film, and the metal film 3 is a gold film. The method for producing the IR sensor preferably includes the following steps:

1. A lead titanate film 2 is deposited on a surface of a n/p$^+$ substrate 1 in a radio frequency (RF) sputtering system, wherein the target has the diameter of 5 cm, the clearance between the target and the substrate is about 5 cm, the RF input power is about 100 W, the sputtering gas species consists of 90% Ar and 10% $O_2$, the gas pressure is set to be about 6 mtorr and the substrate temperature is about 500° C.
2. A gold film 3 is appropriately masked and then deposited on the lead titanate film 2 by E-gun evaporation to serve as a light-absorbing electrode.
3. An aluminum film 4 is formed on a surface of the substrate opposite to the surface having the lead titanate film 2 thereon for serving as a contact electrode.

Of course, there are many methods for applying a lead film to the substrate, e.g. direct current sputtering, E-gun, MBE, sol-gel, etc. However, the material for metal target of the direct current sputtering method is limited, the growth time for E-gun method is too long to make the composition of the grown thin film identical to that of the target, the instrument for MBE method is too expensive to be used in mass production, and the obtained thin film from sol-gel method is subject to accelerative aging and fatigue. The RF sputtering method is most preferably used for growing the lead titanate film.

Of course, the n/p$^+$ substrate 1 can be substituted by p/n$^+$ substrate only by reversing the applied voltage polarity.

In another preferred embodiment, the ferroelectric film 2 is a lead zirconium titanate ($PbZr_{0.53}Ti_{0.47}O_3$) film. The method for producing the IR sensor preferably includes the following steps:

1. A lead zirconium titanate film is deposited on a surface of a n/p$^+$ or p/n$^+$ substrate in a KrF pulse-mode laser evaporation system, wherein the laser beam wavelength is 248 nm, the pulse width is 25 ns, the operation frequency is 3 Hz, and the output energy is 400 mJ.
2. A gold film is appropriately masked and then deposited on the lead zirconium titanate film by E-gun evaporation to serve as a light-absorbing electrode.
3. An aluminum film is formed on a surface of the substrate opposite to the surface having the lead zirconium titanate film thereon for serving as a contact electrode.

As described in the foregoing, the IR sensor according to the present invention is quite different from the conventional one. The present IR sensor has a metal/ferroelectric-film/p-n-junction-substrate structure, while the conventional sensor has a metal/ferroelectric film/semiconductor field effect transistor (MFS-FET) structure. The present sensor is generalized to be similar to the structure of metal/insulator/semiconductor (MIS). The MIS structure has an advantage of rapid switching. The present IR sensor utilizes the ferroelectric film to substitute for the insulator to achieve an IR sensor with rapid switching function.

The current vs. voltage plot of the IR sensor according to the present invention is similar to that of the MIS switching diode (MISS). An appropriate bias is applied to the sensor before exposure to have the sensor in an off-state. On this moment, the voltage mainly drops at the depletion region of n layer of the substrate 1, so the ferroelectric film 2 does not have an efficient electric field to generate tunneling current. However, when the sensor is exposed in infrared ray, the temperature of the ferroelectric film 2 will be slightly raised due to the absorption of infrared ray so that the polarization in the film is weakened and then the antipolarization electric field is also weakened. As a result, the macroscopic electric field becomes larger, and the probability that the carriers penetrate the ferroelectric film 2 increases with the increase of the macroscopic electric field. When the intensity of infrared ray is up to a critical value, the sensor will convert from off-state into on-state.

The test results of the characters of the IR sensor according to the present invention will be described below.

Figure 2:
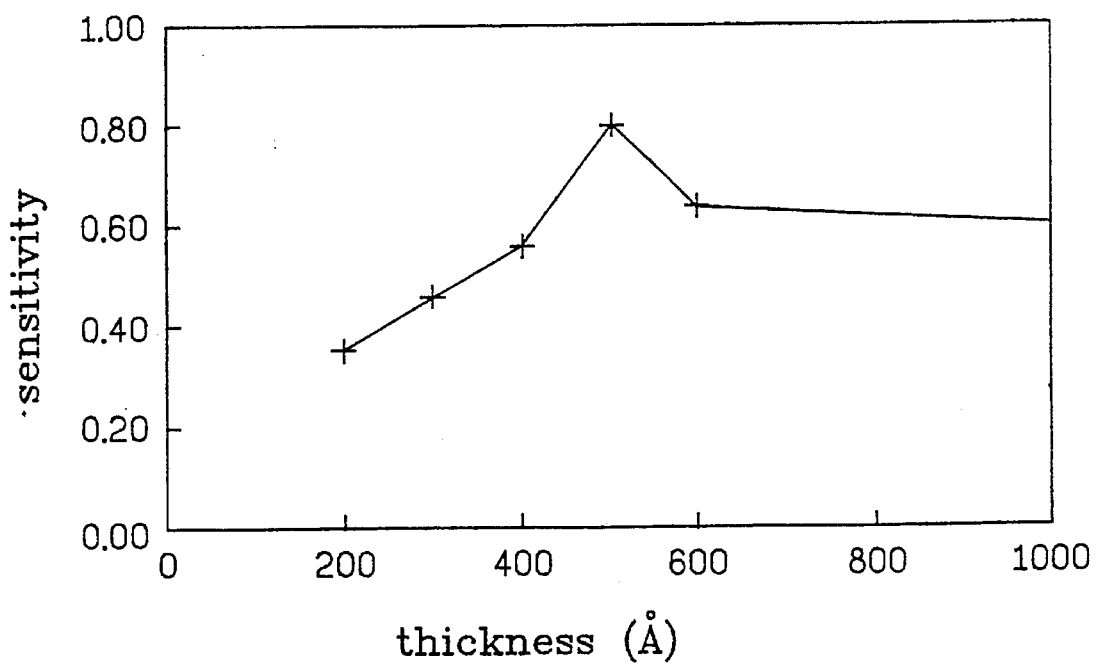
FIG. 2 is a sensitivity for infrared ray vs. thickness of a lead titanate film plot according to the present invention.

Please refer to FIG. 2 which is a sensitivity for infrared ray vs. thickness of a lead titanate film plot according to the present invention. In the test shown in FIG. 2, the thickness of the lead titanate film is ranged within 200 Å~1000 Å. From the figure, it can be shown that the present IR sensor has good sensitivity for sensing infrared ray. When the thickness is about 500 Å, the best sensitivity can be achieved. If the thickness of the lead titanate film is less, the current vs. voltage curve draws near a diode curve. In other words, the switching character is weakened. When the thickness is about 50 Å, the curve becomes a p-n diode current vs. voltage curve. Meanwhile, the sensor can still sense infrared ray, but the switching character vanishes. On the other hand, if the thickness is over 5000 Å, the lead titanate film serves as an insulator so that the switching phenomenon disappears.

Figure 3:
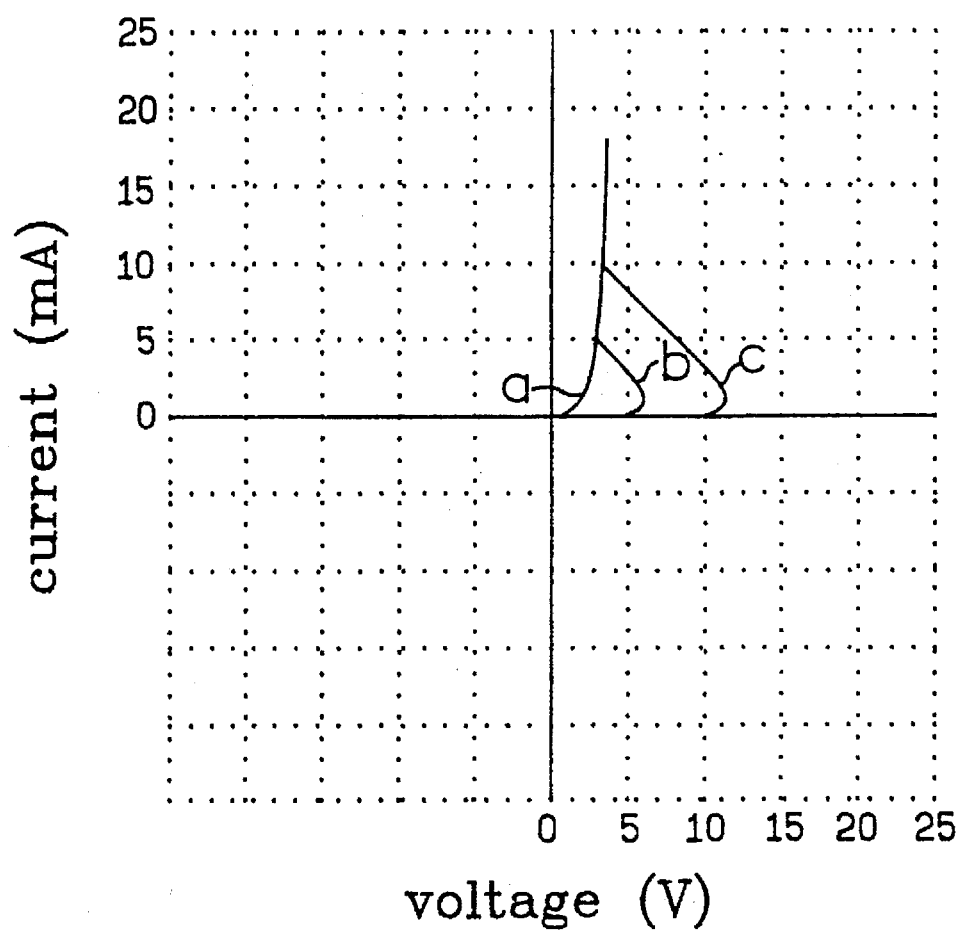
FIG. 3 is a current vs. voltage plot showing an IR sensor including a lead titanate film of 500 Å in various intensities of infrared ray.

FIG. 3 is a current vs. voltage plot showing an IR sensor including a lead titanate film of 500 Å in various intensities of infrared ray. The intensity of infrared ray of the curve "a" is 1000 μW, that of the curve "b" is 200 μW, and that of the curve "c" is 0 μW. From this figure, it can be seen that the switching voltage change is proportional to the intensity of infrared ray. Between the off-state at 11 volts and the on-state at 2 volts, there is a difference of 9 volts for sensing infrared ray.

Figure 4:
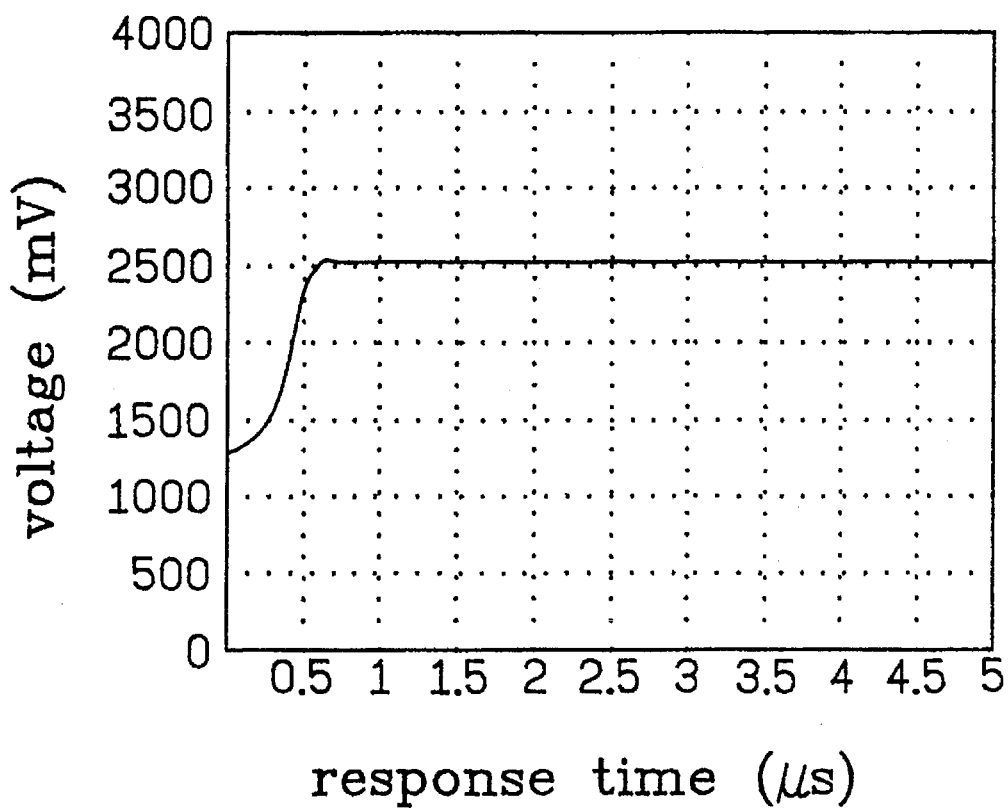
FIG. 4 is a schematic plot showing a load wave when the present sensor is switched from off-state to on-state by infrared ray.

FIG. 4 is a schematic plot showing a load wave when the present sensor is switched from off-state to on-state by infrared ray. It is shown from this figure, the response time (about 647.5 ns) of the present IR sensor is much shorter than the other types of thermal electric IR sensors.

To sum up, the IR sensor according to the present invention possesses the following features of:

1. being able to be operated at room temperature;
2. having short response time;
3. being easy to be fabricated;
4. switching the electrical circuit by itself without other electrical or mechanical components for a given threshold level of infrared ray power; and
5. having a wide voltage variation of 9 volts for sensing the infrared ray from off-state-voltage of 11 V to on-state-voltage of 2 V.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An infrared ray (IR) sensor comprising:

a substrate having a p-n junction;

a ferroelectric film formed on a surface of said substrate, said ferroelectric film being configured to facilitate penetration of current therethrough with exposure to an infrared ray; and a metal film formed on said ferroelectric film for serving as an infrared-ray receiving electrode.

2. An infrared ray sensor according to claim 1 wherein said substrate is a n/p$^+$ type silicon substrate.

3. An infrared ray sensor according to claim 1 wherein said substrate is a p/n$^+$ type silicon substrate.

4. An infrared ray sensor according to claim 1 wherein said ferroelectric film is a film of lead titanate.

5. An infrared ray sensor according to claim 4 wherein a thickness of said lead titanate film is ranged from about 200 Å to 1000 Å.

6. An infrared ray sensor according to claim 1 wherein said ferroelectric film is a film of lead zirconium titanate (PbZr$_{0.53}$Ti$_{0.47}$O$_3$).

7. An infrared ray sensor according to claim 1 wherein said metal film is a film of gold.

8. An infrared ray sensor according to claim 1 further comprising an aluminum film formed on a surface of said substrate opposite to said surface having said ferroelectric film thereon for serving as a contact electrode.

9. A method for producing an infrared ray sensor, comprising the steps of:

providing a substrate having a p-n junction;

depositing a ferroelectric film on a surface of said substrate in a radio frequency (RF) sputtering system, said ferroelectric film being selected to facilitate current flow in response to an infrared ray; and depositing a metal film on said ferroelectric film by vapor evaporation.

10. A method according to claim 9 wherein said substrate is a n/p$^+$ type silicon substrate.

11. A method according to claim 9 wherein said substrate is a p/n$^+$ type silicon substrate.

12. A method according to claim 9 wherein said ferroelectric film is a film of lead titanate.

13. A method according to claim 12 wherein a thickness of said lead titanate film is ranged from about 200 Å to 1000 Å.

14. A method according to claim 9 wherein said metal film is a film of gold.

15. A method according to claim 9 further comprising a step of depositing an aluminum film on a surface of said substrate opposite to said surface having said ferroelectric film thereon by vapor evaporation for serving as a contact electrode.

16. A method according to claim 9 wherein said RF sputtering system has a target having a diameter of 5 cm, a clearance of 5 cm between said target and said substrate, an RF input power of 100 W, a sputtering gas species of 90% Ar and 10% O$_2$, a gas pressure of 6 mtorr and a substrate temperature of 500° C.

17. A method for producing an infrared ray sensor, comprising the steps of:

providing a substrate having a p-n junction;

depositing a ferroelectric film on a surface of said substrate in a KrF pulse-mode laser evaporation system, said ferroelectric film being penetrable by a current upon exposure to an infrared ray; and depositing a metal film on said ferroelectric film by vapor evaporation.

18. A method according to claim 17 wherein said substrate is a n/p$^+$ type silicon substrate.

19. A method according to claim 17 wherein said substrate is a p/n$^+$ type silicon substrate.

20. A method according to claim 17 wherein said ferroelectric film is a film of lead zirconium titanate (PbZr$_{0.53}$Ti$_{0.47}$O$_3$).

21. A method according to claim 17 wherein said metal film is a film of gold.

22. A method according to claim 17 further comprising a step of depositing an aluminum film on a surface of said substrate opposite to said surface having said ferroelectric film thereon by vapor evaporation for serving as a contact electrode.

23. A method according to claim 17 wherein said KrF pulse-mode laser evaporation system has a laser beam wavelength of 248 nm, a pulse width of 25 ns, an operation frequency of 3 Hz, and an output energy of 400 mJ.

* * * * *